United States Patent
Khorram

(10) Patent No.: US 7,486,147 B2
(45) Date of Patent: Feb. 3, 2009

(54) LOW PHASE NOISE PHASE LOCKED LOOPS WITH MINIMUM LOCK TIME

(75) Inventor: Shahla Khorram, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 133 days.

(21) Appl. No.: 11/634,765

(22) Filed: Dec. 6, 2006

(65) Prior Publication Data

US 2008/0136535 A1   Jun. 12, 2008

(51) Int. Cl.
*H03L 7/00* (2006.01)
(52) U.S. Cl. .................. 331/16; 331/34; 331/177 R; 327/156
(58) Field of Classification Search .................. 331/16, 331/1 A, 34, 177 R; 327/156
See application file for complete search history.

(56) References Cited

U.S. PATENT DOCUMENTS 7,064,591 B1 *  6/2006  Humphreys et al. ......... 327/156

* cited by examiner

*Primary Examiner*—Arnold Kinkead
(74) *Attorney, Agent, or Firm*—Garlick Harrison & Markison; Holly L. Rudnick

(57) ABSTRACT

A phase locked loop with improved lock time is achieved using a controller coupled to receive a reference signal and operable to generate a frequency divider control signal based upon the reference signal to control operation of a frequency divider. The PLL further includes a phase frequency detector for producing an error signal indicative of a difference in phase or frequency between the reference signal and a feedback signal, a charge pump for generating a current pulse proportional to the error signal, a loop filter for filtering the current pulse to produce a control voltage and a voltage controlled oscillator for producing an oscillation based upon the control voltage. The frequency divider is coupled to receive the oscillation and is operable to divide the oscillation by a divide ratio to produce the feedback signal.

14 Claims, 10 Drawing Sheets

LOW PHASE NOISE PHASE LOCKED LOOPS WITH MINIMUM LOCK TIME

CROSS REFERENCE TO RELATED APPLICATIONS

This U.S. application for patent claims the benefit of the filing date of U.S. Provisional Patent Application entitled, PHASE LOCKED LOOP WITH IMPROVED LOCK TIME, having Ser. No. 11/634,765, filed on Nov. 29, 2006, which is incorporated herein by reference for all purposes.

BACKGROUND

1. Technical Field

The present invention relates to wired or wireless radio systems and, more particularly, to any phase locked loop that requires a fast lock time with low phase noise.

2. Related Art

The demand for high performance universal frequency synthesizers is growing with the increasing performance and integration requirements of wireless radio frequency (RF) systems, such as cellular telephony and FM radio systems. Phase locked loop (PLL) frequency synthesis is a popular indirect frequency synthesis method for high performance applications due to its agility and the ability of synthesizing frequencies over wide bandwidths with narrow channel spacing. However, PLL synthesizer design still remains a challenging aspect of RF system design, because of the stringent requirements typically imposed on frequency synthesizers. For example, frequency synthesizers are typically required to be defined with an output frequency accuracy on the order of a few parts per million (PPM). Furthermore, in most cases, the output frequency must also be capable of being varied in small precise steps, such as a few kilo-hertz (kHz), corresponding to the RF channel spacing.

In addition to accuracy and channel spacing, other aspects of PLL frequency synthesizers influence the performance of a receiver, such as phase noise. In radio receivers, if the phase noise produced by the frequency synthesizer mixes with nearby interferers that are then converted onto the desired channel, the signal-to-noise ratio of the received signal can be adversely affected. PLL frequency synthesizers typically include a precise crystal oscillator (X-TAL) providing a reference frequency, a phase frequency detector (PFD), a charge pump (CP), a lowpass loop filter (LPF), a voltage controlled oscillator (VCO), and one or more divider blocks in the feedback path that each divide the incoming signal by some integer of either fixed or on-the-fly programmable value to produce a feedback signal. The strict phase noise requirements of PLL frequency synthesizers sometimes dictate a narrow LPF bandwidth and a low kVCO, where kVCO denotes the VCO gain (i.e., the sensitivity of the VCO to changes in the control voltage).

However, such narrow loop filter bandwidth requirements and low kVCO requirements, in combination with high divide ratios in the feedback path and low reference frequencies, increase the lock time of the PLL. As used herein, the term "lock time" refers to an indication of how fast a new frequency is established when the RF receiver commands a change in the channel. The maximum lock time allowed in typical RF systems can vary from a few microseconds (us) to a few tens of milliseconds (ms.). However, for PLL's with a low kVCO and a narrow loop filter bandwidth, the actual lock time can be orders of magnitude greater than the maximum desired lock time.

Therefore, a need exists for a PLL design for use in radio transceivers that minimizes the lock time.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
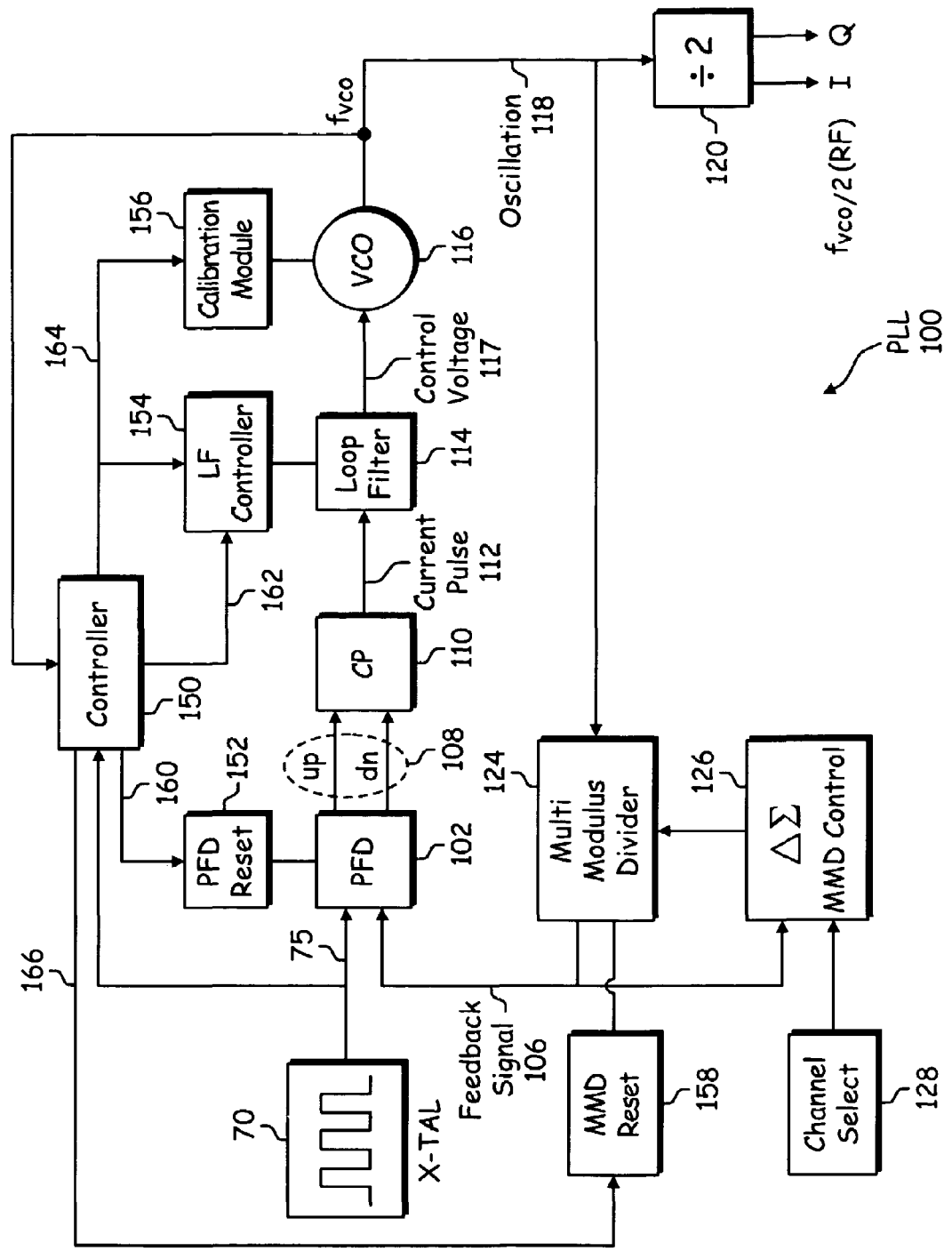
FIG. 1 is a schematic block diagram of a phase locked loop (PLL) in accordance with the present invention.

FIG. 1 is a schematic block diagram of a phase locked loop (PLL) 100 in accordance with embodiments of the present invention. The PLL includes a phase frequency detector (PFD) 102 that is coupled to receive a precise reference signal 75 from a crystal oscillator 70 for comparing with a feedback signal 106 to produce an error signal 108 indicative of a phase or frequency difference between the reference signal 75 and the feedback signal 106. A charge pump (CP) 110 produces current pulses 112 based upon the error signal 108, and provides the current pulses 112 to a low pass loop filter (LF) 114.

LF 114 produces a control voltage 117 from the current pulses 112, and provides the control voltage 117 to a voltage controlled oscillator (VCO) 116. The VCO 116 has a low kVCO, where kVCO denotes the VCO gain (i.e., the sensitivity of the VCO to changes in the control voltage). VCO 116 produces an oscillation ($f_{VCO}$) 118 based on the control voltage 117, and inputs the oscillation 118 to a divider 120 in a first divider stage of a divider chain to produce I and Q components of a local oscillation signal ($f_{VCO/2}$) to be mixed with an RF signal in a radio receiver. In the described embodiment, the divider 120 is a fixed integer divider. In addition, a programmable divider, such as a multi-modulus divider (MMD) 124, is used in a last divider stage of the divider chain before the feedback signal 106 is produced therefrom and is provided to the PFD 102. MMD 124 sets the integer divider ratio based upon a divider control signal received from a ΔΣ MMD controller 126. ΔΣ MMD controller 126 generates control signals to MMD 124 based upon a channel select value received from channel select logic 128. The selection of a new divide ratio is triggered by a rising edge of the MMD 124 output, and hence occurs with a rate approximately equal to the reference frequency. In a properly designed PLL, the feedback loop properties of the PLL results in the VCO output "locking" to a frequency equal to the product of crystal oscillator reference frequency and the "average" divide ratio of the divider chain.

In one embodiment, the ΔΣ MMD controller 126 may be an all-digital ΔΣ modulator that is capable of reproducing a high resolution constant input value, for example a 20-bit value, as the time average of a long sequence of coarse integer valued outputs, e.g., binary outputs. Specifically, on a sample-by-sample basis, the coarse ΔΣ modulator output selects the divide ratio for the next cycle. By alternating pseudo randomly between integer divide values, the ΔΣ modulator can effectively interpolate a fractional division ratio with fine resolution such that the frequency resolution requirements of high performance applications, such as cellular telephony, can be accommodated for. For example, in order for the output of the PLL to lock to a frequency of 890.0 MHz, using a 26 MHz crystal reference oscillator 70, the average divide ratio of the MMD 124 must be equal to 890/26=34.2308.

Thus, the channel select 140 input to the ΔΣ modulator 126 is the number 890/26 represented with high accuracy, for example 20 bits. It is the task of the ΔΣ modulator 126 to output only integer valued samples, corresponding to the available divide values of the MMD 124, in such a fashion that the average value of the outputs equals 890/26. This average divide ratio can be achieved in various ways. For example, if a ΔΣ modulator 126 with binary output is employed, the MMD 124 divides by 33 whenever the ΔΣ modulator 126 output equals −1, and the MMD 124 divides by 35 whenever the ΔΣ modulator 126 output equals 1. The ΔΣ modulator 126 chooses between the divide ratios 33 and 35 in such a pattern that the average ratio is 890/26, and such that the sample-by-sample error, which is equal to the difference between the chosen integer divide value and the ratio 890/26, is modulated to predominantly occupy high frequencies.

By providing this spectral shaping of the divide error, most of the error can be removed by the lowpass loop filter (LPF) 114, resulting in a high quality output oscillation, or, equivalently, an output oscillation with very little phase noise, approximately as if the feedback path implemented a true fractional divider. It follows from the above discussion of the PFD 102 and the CP 110 that under nominal conditions, current pulses proportional to either a phase or a frequency difference between the reference and the feedback signals are generated by the PFD/CP combination. The action of the closed feedback loop is to cause the feedback signal to eventually settle such that both signals are "locked" in both phase and frequency. The degree to which deviations away from the locked state are allowed depends upon the sharpness of the loop filter 114 and is one factor in determining the amount of "phase noise" in the output. Thus, a sharper or narrower filter bandwidth reduces the out-of-band phase noise at the PLL output for a low phase noise VCO.

However, as the narrowness of the filter bandwidth increases, so does the lock time of the PLL 100. Thus, although designing the PLL 100 with a narrow PLL signal filter may provide some attenuation of phase noise, in many systems it is difficult or impossible to attenuate the phase noise enough while at the same time employing a PLL signal filter bandwidth large enough to ensure fast settling (lock time).

Therefore, in accordance with embodiments of the present invention, a controller 150 is provided to decrease the lock time of the PLL 100 by controlling the operation of the MMD 124, PFD 102, LF 114 and VCO 116 at initial PLL start up. More specifically, the controller 150 determines phase alignment parameters for the PFD 102 and MMD 124 based on the reference signal 75 and resets the PFD 102 and MMD 124 based on the reference signal 75 and the phase alignment parameters to substantially bring the PLL output into phase lock. Thus, the PLL 100 of FIG. 1 uses pulse alignment of the MMD output (feedback signal 106) and reference clock (reference signal 75) to decrease the lock time of the PLL 100.

For example, for type II PLL's, the controller 150 can initialize or reset the MMD 124 at a time corresponding to an edge of the reference signal 75 to bring the phase of the feedback signal 106 close to the phase of the reference signal 75, and thus bring the PLL output into phase lock, in as little as a few nanoseconds. As another example, for type I PLL's, the controller 150 can initialize or reset the MMD 124 at a time that produces a desired phase offset between the reference signal 75 and the feedback signal 106 to bring the PLL output into phase lock. The desired phase offset in type I PLL's depends on the dynamics of the PLL, and can be programmed into the controller 150. For fine tuning of the calibration edges, the controller 150 can further use the oscillation output ($f_{VCO}$) of the VCO 116.

The controller 150 further minimizes the lock time by calibrating the VCO 116 output to within a small deviation from a desired final frequency of oscillation. For example, in one embodiment, the controller 150 calibrates the VCO 116 to within 50 kHz from the desired VCO oscillation frequency. This calibration process involves a sequence of switching in and out of capacitors that tune the operation frequency of the VCO. Since each bit of a capacitor changes the frequency a different amount, to achieve the desired calibration accuracy, the appropriate number of VCO calibration bits per capacitor is selected for inclusion in the VCO 116. For example, twelve-bit calibration capacitors are typically required to bring the VCO output to within 50 kHz of the desired oscillation frequency. However, the number of calibration bits may vary depending upon the desired calibration accuracy.

An exemplary operation of the PLL 100 of FIG. 1 follows. Upon initialization of the PLL 100 (e.g., at start-up or after a channel hop), the controller 150 calibrates the VCO 116 by generating a calibration signal 164. The calibration signal 164 is received by a calibration module 156 that is operable to switch VCO capacitors in and out to tune the frequency of the VCO 116 to within a small deviation of a desired final frequency of oscillation. The calibration signal 164 is further received by a LF controller 154 that is operable to control the LF 114 to produce and maintain a desired steady-state calibration control voltage during calibration of the VCO 116.

For example, in one embodiment, the controller 150 also generates an initial calibration signal 162 to the LF controller 154, which instructs the LF controller 154 to charge the capacitors within the LF 114 to an initial level (e.g., high voltage). By charging the capacitors initially to high, the LF controller 154 is able to quickly bring the charge on the capacitors within the LF 114 down to a voltage level sufficient to produce the desired calibration control voltage. For example, the LF controller 154 can quickly bring the charge of the capacitors within the LF 114 down to a level that enables the control voltage to settle within 10 mV of the desired calibration control voltage before the start of the VCO calibration.

Substantially simultaneous to generating the calibration signal 164, the controller 150 further generates a phase frequency detector control signal 160 that is received at a PFD reset switch 152 and a frequency divider control signal 166 that is received at an MMD reset switch 158. During calibration of the VCO, the states of each of the control signals 160 and 166 are set to "OFF" to cause the PFD reset switch 152 to turn off the PFD 102 and the MMD reset switch 158 to turn off the MMD 124.

Once the VCO calibration is substantially complete, the controller 150 changes the states of the control signals 160 and 166 from "OFF" to "RESET." Upon receiving the phase frequency detector control signal 160 in a reset state, the PFD reset switch 152 is operable to reset the PFD 102 to start the PFD 102. Likewise, upon receiving the frequency divider control signal 166 in a reset state, the MMD reset switch 158 is operable to reset the MMD 124 to start the MMD 124. In addition, in accordance with embodiments of the present invention, as described above, the controller 150 changes the states of the control signals 160 and 166 from "OFF" to "RESET" based on the reference signal 75 in order to align the PFD input pulses (reference signal 75) with the MMD output pulses (feedback signal 106) according to the desired phase offset to start the PFD 102 in the optimum state for fast locking.

Figure 2:
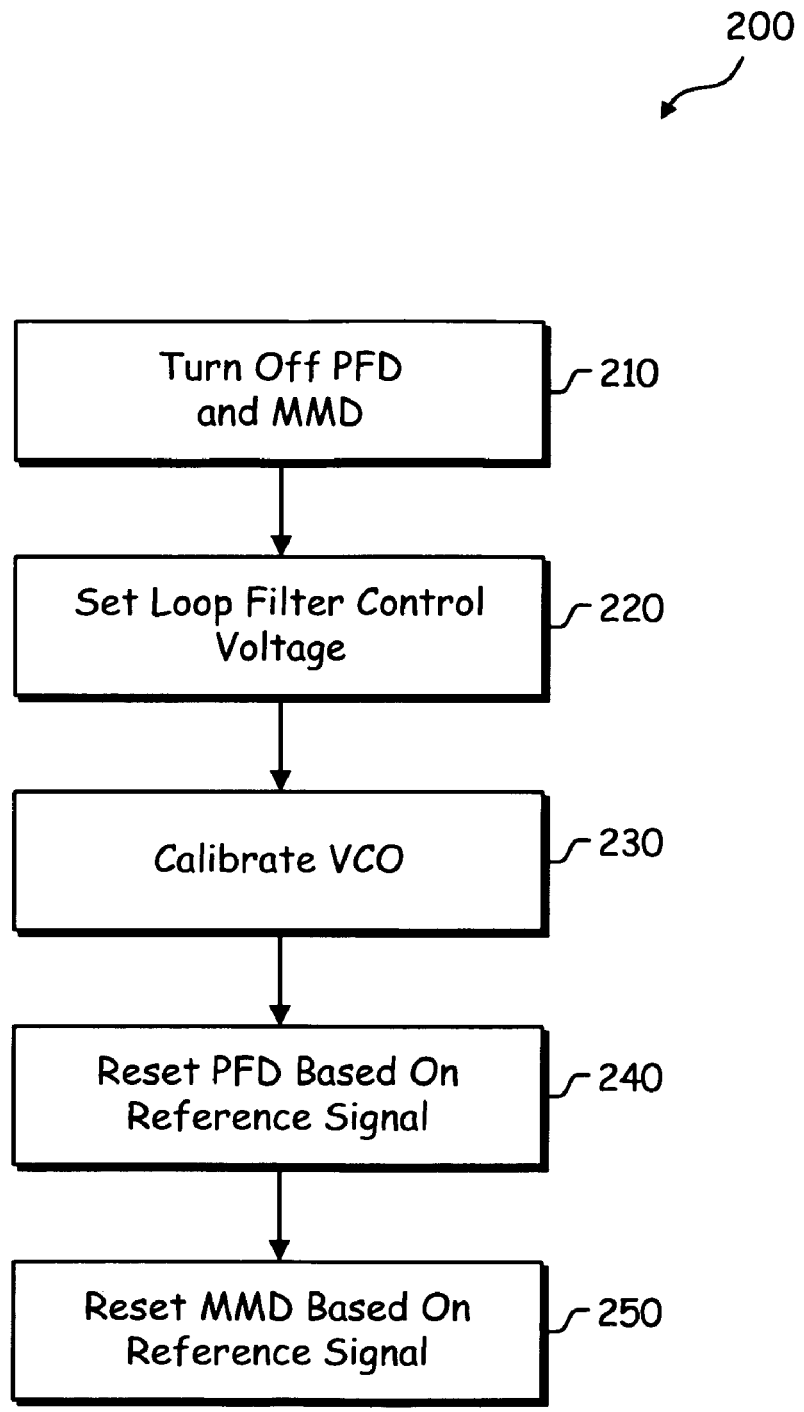
FIG. 2 is a flowchart illustrating an exemplary method for reducing the lock time of a PLL according to one embodiment of the invention.

FIG. 2 is a flowchart illustrating an exemplary method 200 for reducing the lock time of a PLL according to one embodiment of the invention. Initially, the method includes turning off both the phase frequency detector (PFD) and the frequency divider (MMD) in the divider output chain (step 210) of the PLL. Thereafter, the method includes setting the loop filter control voltage to a desired calibration control voltage (step 220) and calibrating the VCO to within an acceptable deviation of a desired oscillation frequency (step 230). Once the VCO has been calibrated, the method includes resetting the PFD (step 240) and the MMD (step 250) based on the reference signal. For example, the PFD and MMD can be reset at a time that substantially brings the PLL output into phase lock.

Figure 3:
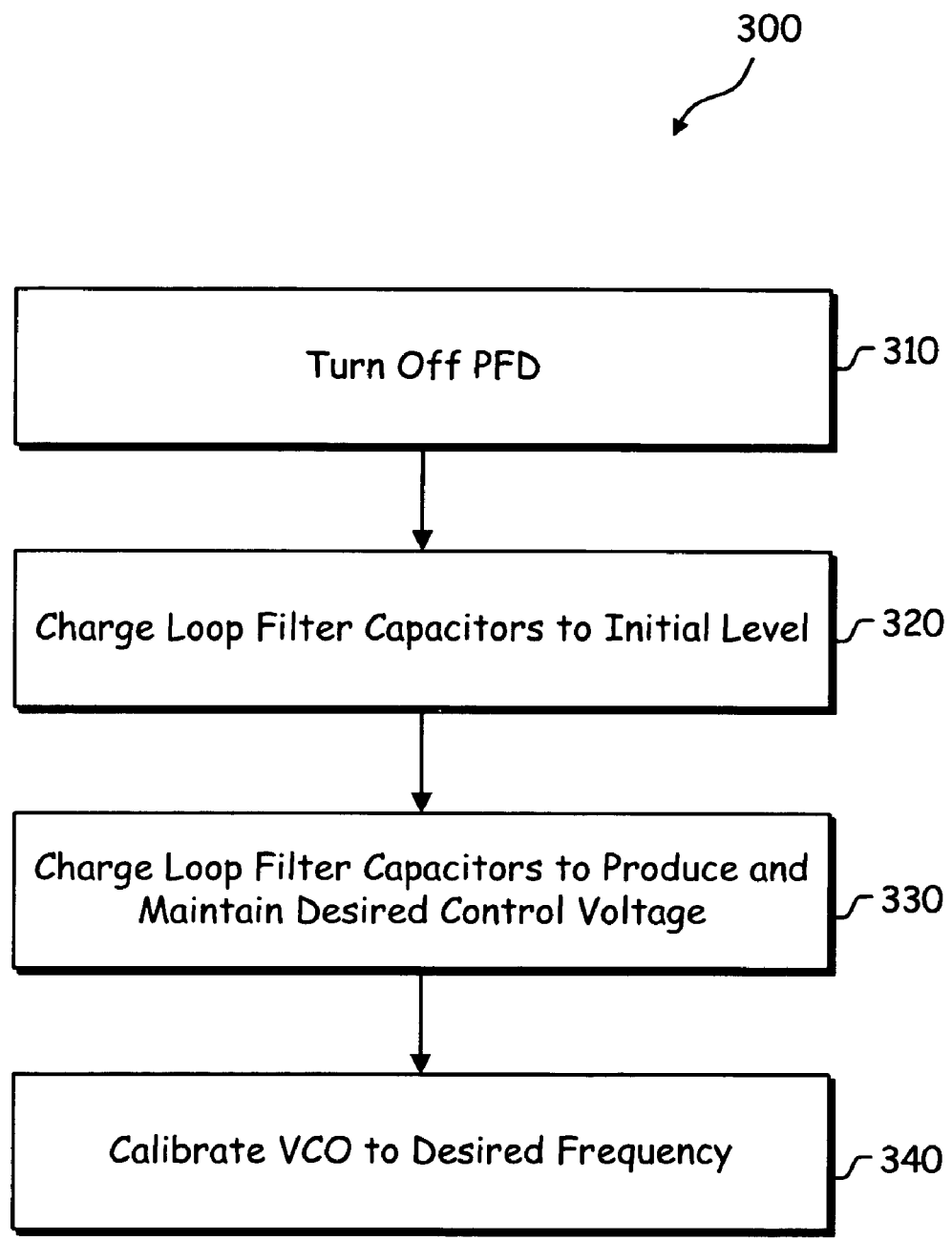
FIG. 3 is a flowchart illustrating an exemplary method for calibrating the VCO to reduce the lock time of the PLL according to one embodiment of the invention.

FIG. 3 is a flowchart illustrating an exemplary method 300 for calibrating the VCO to reduce the lock time of the PLL according to one embodiment of the invention. Initially, the method includes turning off the phase frequency detector (PFD) (step 310) to prevent fluctuations in the calibration control voltage. Once the PFD is turned off, the method includes charging the loop filter capacitors to an initial level (step 320), and then charging the loop filter capacitors to a level sufficient to produce and maintain the desired calibration control voltage (step 330). For example, the loop filter capacitors can initially be charged to high, and then brought down to the appropriate calibration control voltage. Using the calibration control voltage, the VCO is calibrated to a frequency within an acceptable deviation from the desired oscillation frequency (step 340).

Figure 4:
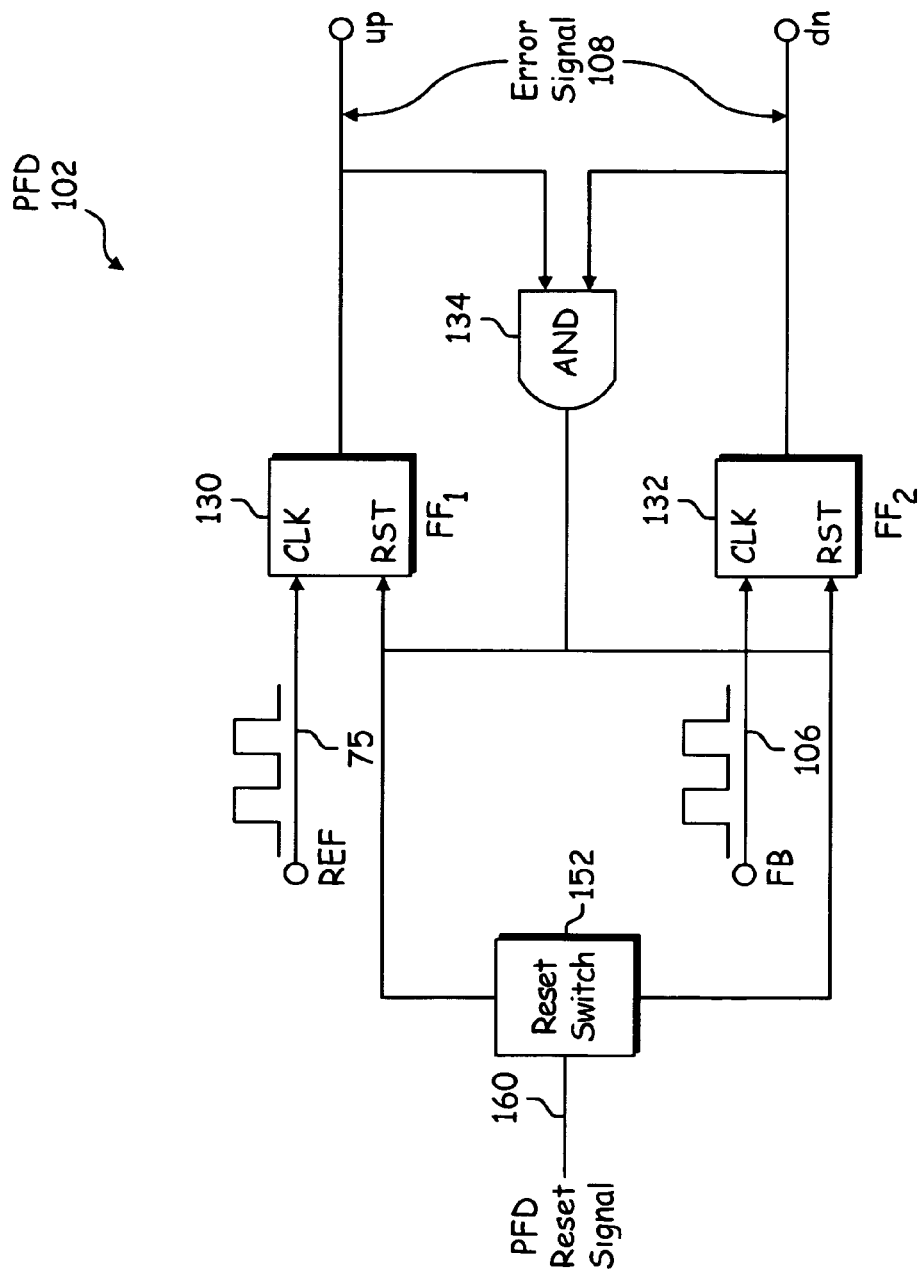
FIG. 4 is a functional block diagram of an exemplary phase-frequency detector of the PLL of the present invention.

FIG. 4 is a functional block diagram of an exemplary phase frequency detector (PFD) 102 of the PLL of the present invention. Two reset-able flip-flops 130 and 132 are coupled with an AND gate 134 in a feedback loop to produce the error signal 108. Once the reset switch 152 resets the flip-flops 130 and 132 upon receiving the phase frequency detector control signal 160 in a reset state, the operation of the PFD 102 is as follows. After reset, the outputs UP and DN are LOW, or 0. Whenever the reference signal 75 (REF) goes HIGH, or 1, then UP goes HIGH. Whenever the feedback signal 106 (FB) goes HIGH, DN goes HIGH momentarily, resulting in a positive edge at the AND gate output. This edge resets the two flip-flops to the initial state (UP,DN)=(0,0). Thus, any phase difference between the two signals REF and FB results in the PFD residing in the state (UP,DN)=(1,0) for a duration of time proportional to the phase difference between REF and FB. Similarly, any difference in frequency between REF and FB results in the PFD residing in either the state (UP,DN)=(1,0) or the state (UP,DN)=(0,1), depending upon the sign of the frequency difference.

Figure 5:
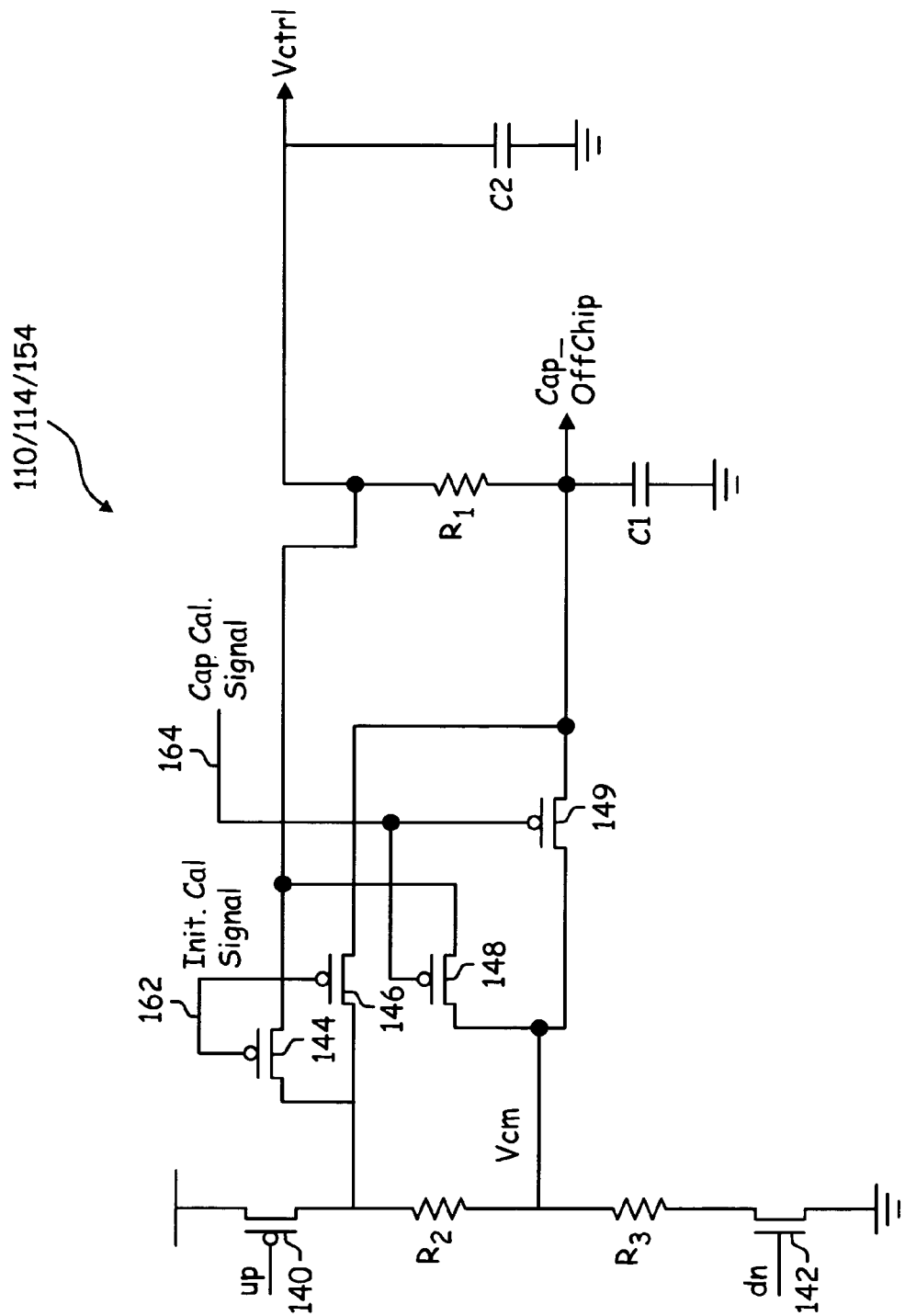
FIG. 5 is a functional block diagram of an exemplary charge pump, loop filter and loop filter controller of the PLL of the present invention.

FIG. 5 is a functional block diagram of an exemplary charge pump 110, loop filter 114 and LF controller 154 of the PLL of the present invention. The charge pump 110 responds to the (UP,DN) control signals of error signal 108 of the PFD by either "pumping" current into the loop filter 114 or moving current out of the loop filter 114 and "pumping" it into ground. The charge pump (CP) 110 includes two equally weighted (matching) current sources (not shown), each with a nominal output current ($I_{CP}$), in an arrangement with two resistors R2 and R3 and two switches implemented as MOSFETs 140 and 142 that are operatively biased by input signals UP and DN of error signal 108. As configured, MOSFET 140 is a PMOS, while MOSFET 142 is an NMOS. Thus, CP 110 essentially functions as an asynchronously clocked digital-to-analog converter (DAC) whose nominal output Vcm depends upon the digital inputs UP and DN such that:

$$Vcm(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses (Vcm) of CP 110 are filtered by the loop filter 114, thereby generating a smooth output control voltage ($V_{ctrl}$). The loop filter 114 shown in FIG. 5 consists of passive components, e.g., resistor R1 and capacitors C1 and C2. In addition, the LF 114 may include additional off-chip capacitors (not shown) or a different LF 114 configuration.

In accordance with embodiments of the present invention, as shown in FIG. 5, the loop filter 114 and LF controller 154 are implemented using an on-chip narrow-band loop filter with a switched-capacitor configuration. For example, as shown in FIG. 5, the LF controller 154 is implemented with switches 144, 146, 148 and 149. Switches 144 and 146 are operable to charge capacitors C1 and C2, respectively, to an initial value (e.g., high) upon receipt of the initial calibration signal 162, while switches 148 and 149 are operable to charge capacitors C1 and C2, respectively, to a calibration level sufficient to produce the desired calibration control voltage Vctrl upon receipt of the calibration signal 164.

An exemplary mode of operation of the combination of the charge pump 110 and loop filter 114 of the present invention is as follows. As described above, charge pump 110 produces a current pulse based upon the error signal. However, if the PFD is "OFF," the charge pump 110 does not produce any current pulses. Therefore, while the PFD is off, the initial calibration signal 162 goes high placing switches 144 and 146 in an "ON" or closed state to enable the capacitors C1 and C2 to charge to high. Once the capacitors C1 and C2 are fully charged, the initial calibration signal 162 goes low (thus placing switches 144 and 146 in an "OFF" or closed state) and the calibration signal 164 goes high placing switches 148 and 149 in an "ON" or closed state to enable the capacitors C1 and C2 to charge to a voltage corresponding to the desired calibration control voltage. After calibration is complete, the calibration signal 164 goes low placing switches 148 and 149 in an "OFF" or open state to enable the capacitors C1 and C2 to charge to a voltage corresponding to the current pulse (Vcm).

Figure 6A:
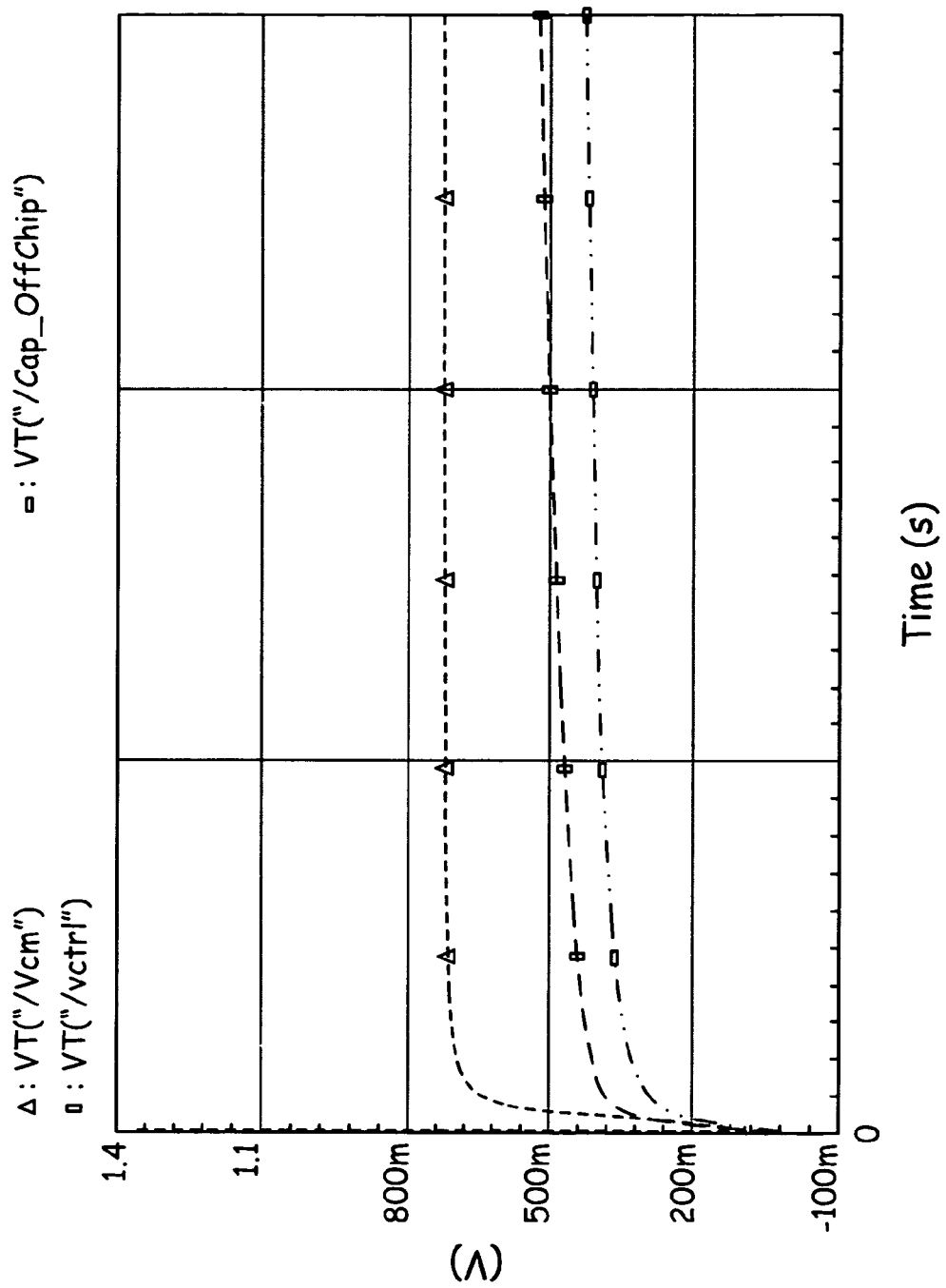
FIG. 6A is a timing diagram illustrating exemplary loop filter settling times of the PLL without initial capacitor charging.
Figure 6B:
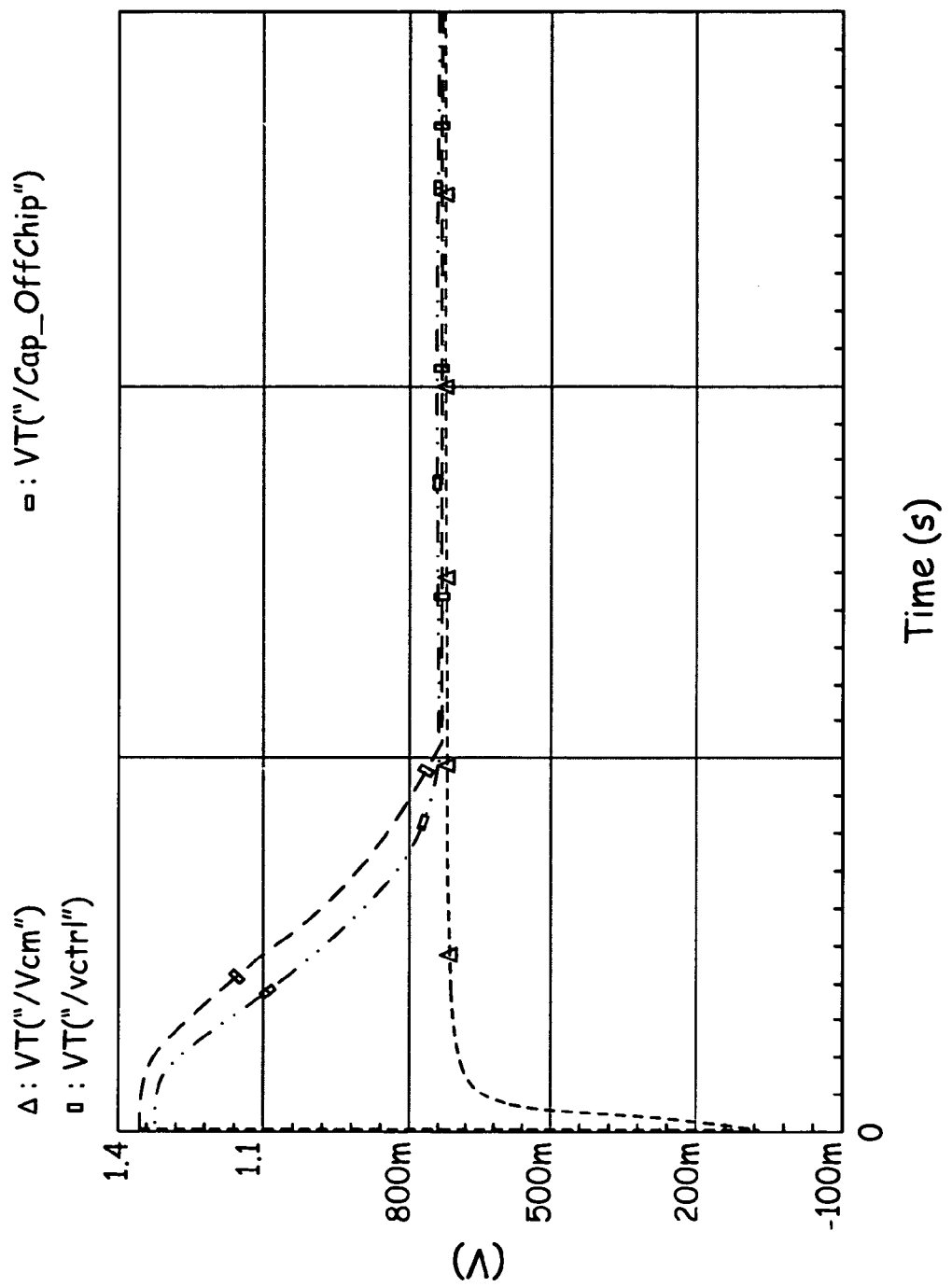
FIG. 6B is a timing diagram illustrating exemplary loop filter settling times of the PLL with initial capacitor charging.

FIGS. 6A and 6B are timing diagrams illustrating exemplary loop filtering settling times of the PLL. FIG. 6A illustrates an exemplary loop filter settling time without any initial charge up of the loop filter capacitors, while FIG. 6B illustrates an exemplary loop filter settling time with initial charging of the loop filter capacitors. In both FIGS. 6A and 6B, the curve represented by the small dashed line illustrates the settling time for node Vcm, as shown in FIG. 5, the curve represented by the large dashed line illustrates the settling time for node Vctrl, as shown in FIG. 5, and the curve represented by the dashed-dotted line illustrates the settling time for node $V_{Cap\_OffChip}$, as shown in FIG. 5. The loop filter stabilizes (i.e., settles) when the voltage at nodes Vctrl and $V_{Cap\_OffChip}$ reaches the voltage at node Vcm. Thus, from a comparison of FIGS. 6A and 6B, it can be seen that the settling time with initial charging of the loop filter capacitors is shorter than without initial charging.

Figure 7:
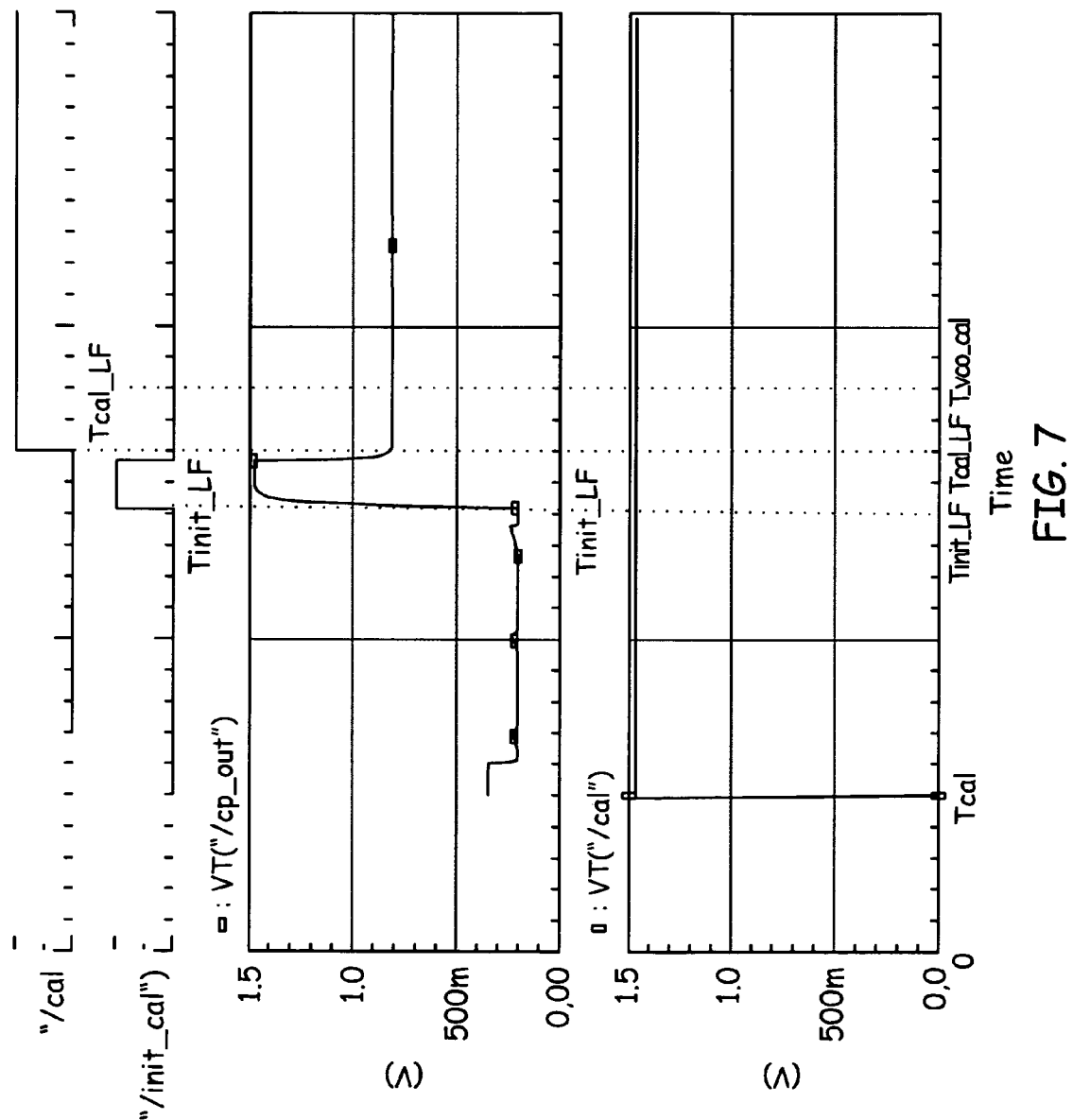
FIG. 7 is a timing diagram illustrating an exemplary VCO calibration of the PLL of the present invention.

FIG. 7 is a timing diagram illustrating an exemplary VCO calibration of the PLL of the present invention. The top diagram represents the state of the calibration signal (164, shown in FIG. 5) generated by the controller (150, shown in FIG. 1), the next diagram below the calibration signal diagram represents the state of the initial calibration signal (162, shown in FIG. 5) generated by the controller (150, shown in FIG. 1), the next diagram below the initial calibration signal diagram represents the voltage of the loop filter and the bottom diagram represents the state of a start calibration signal (not previously shown) generated by the controller. At time Tcal, the start calibration signal goes high initiating the calibration process. At time Tinit_LF, the initial calibration signal 162 goes high to initialize the loop filter and improve the loop filter settling time by charging the capacitors to an initial high voltage. Then, at time Tcal_LF, the calibration signal 164 goes high bringing the voltage down to the desired calibration control voltage. Finally, at time T_vco_cal, the calibration of the VCO begins to tune the VCO output to the desired oscillation frequency.

Figure 8:
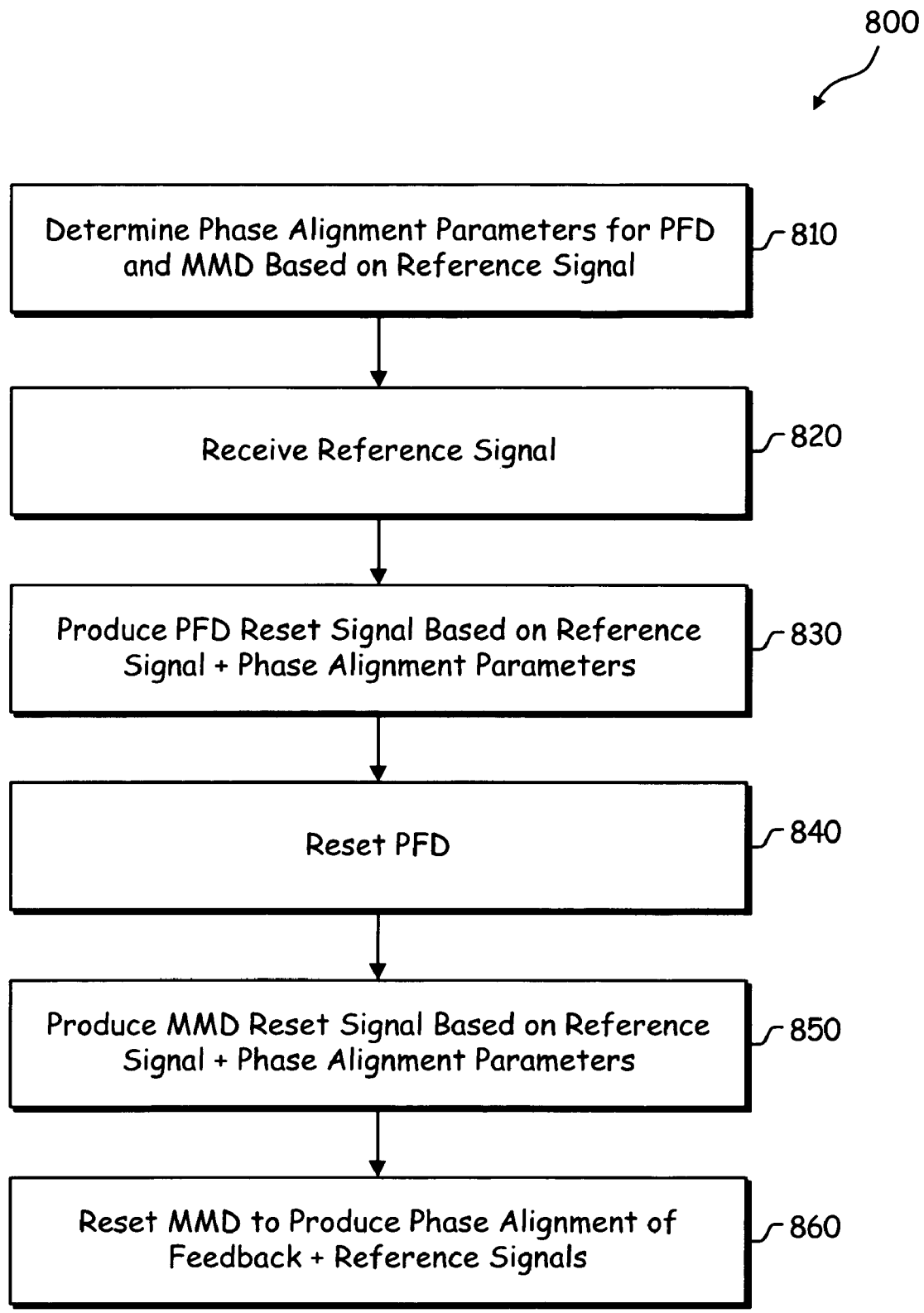
FIG. 8 is a flowchart illustrating an exemplary method for resetting the multi-modulus divider (MMD) of the PLL to reduce the lock time of the PLL according to one embodiment of the present invention.

FIG. 8 is a flowchart illustrating an exemplary method 800 for resetting the multi-modulus divider (MMD) of the PLL to reduce the lock time of the PLL according to one embodiment of the present invention. Initially, the method includes determining phase alignment parameters for the phase frequency detector (PFD) and the frequency divider (MMD) based on the reference signal (step 810). For example, in one embodiment, the phase alignment parameters can indicate the desired edge of the reference signal at which the PFD and MMD will be reset. Thereafter, the method includes receiving the reference signal (step 820), producing a PFD reset signal based on the reference signal and phase alignment parameters (step 830) to reset the PFD (step 840) and producing an MMD reset signal based on the reference signal and the phase alignment parameters (step 850) to reset the MMD (step 860). For example, the PFD reset signal and MMD reset signal can be generated at a time such that the PFD and MMD will be reset at substantially the same time corresponding to a particular edge of the reference signal to produce phase alignment of the MMD output (feedback signal) and PFD input (reference signal).

Figure 9:
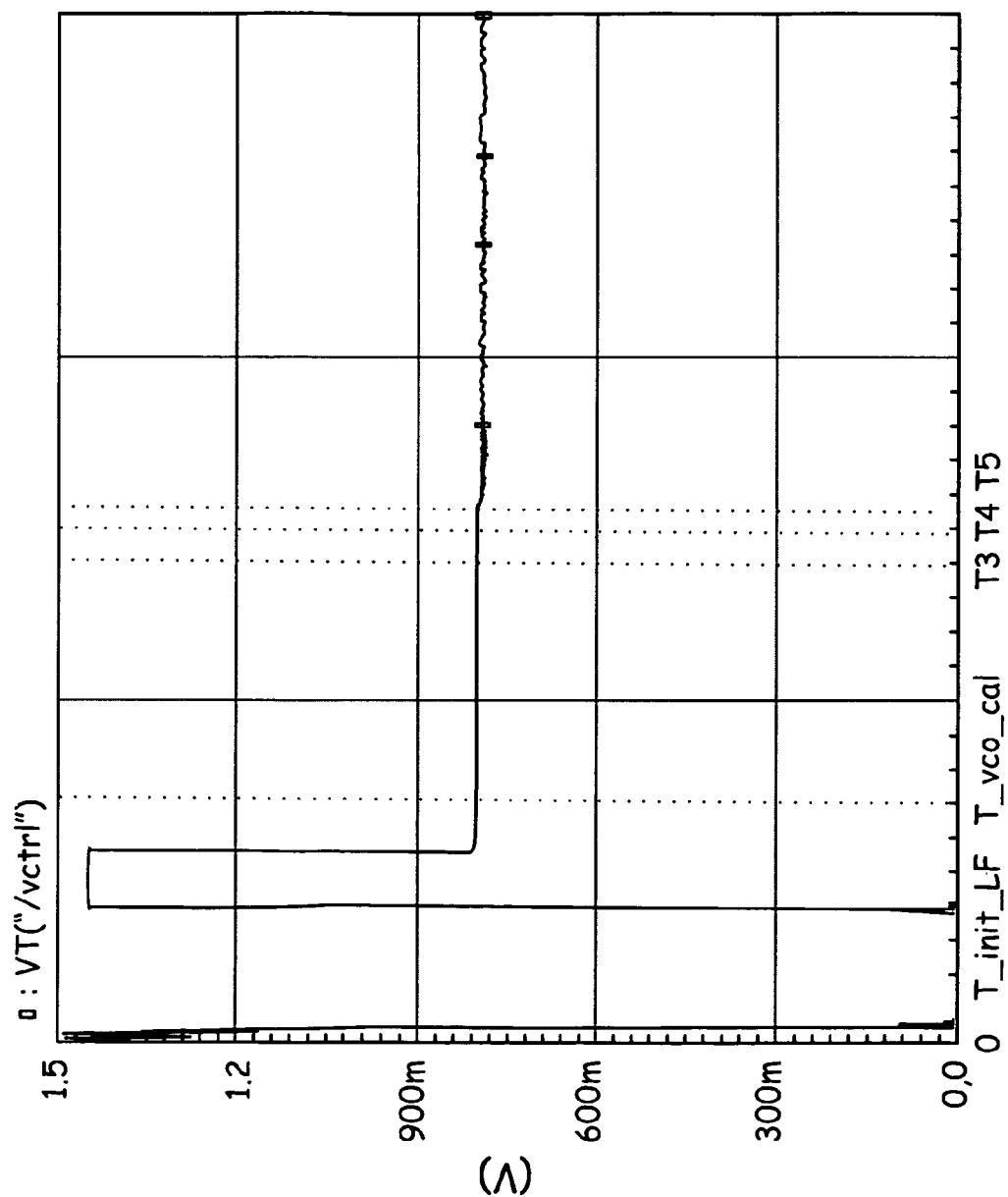
FIG. 9 is a timing diagram illustrating an exemplary lock time of the PLL of the present invention.

FIG. 9 is a timing diagram illustrating an exemplary lock time of the PLL of the present invention. As in FIG. 7, at time T_init_LF, the loop filter is initialized by charging the capacitors to an initial high voltage and then bringing the voltage down to the desired calibration control voltage. Thereafter, at time T_vco_cal, the calibration of the VCO begins to tune the VCO output to the desired oscillation frequency. At time T3, the VCO calibration process is completed. At time T4, the MMD and PFD are reset based on the reference signal, and at T5, the PLL is started in closed loop operation. As can be seen in FIG. 9, after calibration is complete, the PLL is able to quickly lock the VCO oscillation the desired phase and frequency.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has further been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The preceding discussion has presented a phase locked loop architecture with a reduced lock time and method of operation thereof. As one of ordinary skill in the art will appreciate, other embodiments may be derived from the teaching of the present invention without deviating from the scope of the claims.

The invention claimed is:

1. A phase locked loop, comprising:
   a phase frequency detector operable to produce an error signal indicative of a difference in phase or frequency between a reference signal and a feedback signal;
   a charge pump operable to generate a current pulse proportional to said error signal;
   a loop filter operable to filter said current pulse to produce a control voltage;
   a voltage controlled oscillator operable to produce an oscillation based upon said control voltage;
   a frequency divider coupled to receive said oscillation and operable to divide said oscillation by a divide ratio to produce said feedback signal;
   a controller coupled to receive said reference signal and operable to generate a frequency divider control signal based upon said reference signal to control operation of said frequency divider, to generate a phase frequency detector control signal substantially simultaneous to said frequency divider control signal to control operation of said phase frequency detector and to generate a calibration signal to control calibration of said voltage controlled oscillator;
   a calibration module operable to calibrate said voltage controlled oscillator upon receipt of said calibration signal;
   a loop filter controller coupled to receive said calibration signal and operable to produce and maintain said control voltage at a calibration control voltage for calibration of said voltage controlled oscillator;
   a divider reset switch coupled to receive said frequency divider control signal and operable to reset said frequency divider when said frequency divider control signal is in a reset state; and
   a phase frequency reset switch operable to reset said phase frequency detector when said phase frequency detector control signal is in a reset state;
   wherein said controller is further operable to generate said frequency divider control signal in said reset state at a time that substantially brings an output of said phase locked loop into phase lock.

2. The phase locked loop of claim 1, wherein said calibration module is operable to calibrate said voltage controlled oscillator to within an acceptable deviation from a desired frequency of said oscillation.

3. The phase locked loop of claim 1, wherein:
   said controller is further operable to generate an initial calibration signal and to provide said initial calibration signal to said loop filter controller;
   said loop filter controller is further operable to charge at least one capacitor within said loop filter to an initial level upon receipt of said initial calibration signal; and
   said loop filter controller is further operable to charge said at least one capacitor to a calibration level sufficient to produce said calibration control voltage after charging to said initial level.

4. The phase locked loop of claim 1, wherein
   said controller is further operable to substantially simultaneously generate said frequency divider control signal in an off state and said phase frequency detector control signal in an off state;
   said divider reset switch is operable to turn off said frequency divider when said frequency divider control signal is in said off state; and
   said phase frequency detector reset switch is operable to turn off said phase frequency detector when said phase frequency detector control signal is in said off state.

5. The phase locked loop of claim 4, wherein said controller generates said frequency divider control signal and said phase frequency detector control signal in said respective off states substantially simultaneous to generating said calibration signal.

6. The phase locked loop of claim 5, wherein said controller generates said frequency divider control signal and said phase frequency detector control signal in said respective reset states upon completion of the calibration of said voltage controlled oscillator by said calibration module.

7. The phase locked loop of claim 1, wherein said frequency divider is a multi-modulus frequency divider (MMD), and further comprising:
   a MMD controller coupled to said MMD to set an integer divider ratio of said MMD based upon a current channel value.

8. A method for reducing the lock time of a phase locked loop, comprising the steps of:
   turning off both a phase frequency detector and a frequency divider;
   setting a calibration control voltage for a voltage controlled oscillator;
   calibrating said voltage controlled oscillator using said calibration control voltage to produce said oscillation with a frequency substantially equivalent to a desired output frequency;
   resetting said phase frequency detector based on said reference signal to enable said phase frequency detector to produce an error signal indicative of a difference in phase or frequency between a reference signal and a feedback signal, said error signal setting an operating control voltage for said voltage controlled oscillator; and
   resetting said frequency divider based on said reference signal to enable said frequency divider to divide said oscillation produced by said voltage controlled oscillator in response to said operating control voltage by a divide ratio to produce said feedback signal.

9. The method of claim 8, wherein said steps of resetting said phase frequency detector and resetting said frequency divider further comprise the step of:
   resetting said phase frequency detector and said frequency divider at a time that substantially brings an output of said phase locked loop into phase lock.

10. The method of claim 8, wherein said setting said calibration control voltage further comprises the steps of:
    charging at least one capacitor to an initial level; and
    charging said at least one capacitor to a calibration level sufficient to produce said calibration control voltage.

11. The method of claim 8, wherein said step of turning off said phase frequency detector further comprises the step of:
    turning off said frequency divider substantially simultaneous to turning off said phase frequency detector.

12. The method of claim 11, wherein said step of turning off said frequency divider is performed substantially simultaneous to said step of charging said at least one capacitor to said calibration level.

13. The method of claim 12, wherein said steps of resetting said phase frequency detector and resetting said frequency divider further comprise the steps of:
- determining phase alignment parameters for said phase frequency detector and said frequency divider based on said reference signal;
- producing a phase frequency detector control signal based on said reference signal and said phase alignment parameters;
- resetting said phase frequency detector based on said phase frequency detector control signal;
- producing a frequency divider control signal based on said reference signal and said phase alignment parameters; and
- resetting said frequency divider based on said frequency divider control signal to substantially align the phases of said feedback signal and said reference signal according to a desired phase offset therebetween.

14. The method of claim 8, wherein said step of resetting said frequency divider further comprises the step of:
- setting an integer divider ratio of said frequency divider based upon a current channel value.

* * * * *

UNITED STATES PATENT AND TRADEMARK OFFICE
CERTIFICATE OF CORRECTION

| | |
|---|---|
| PATENT NO. | : 7,486,147 B2 |
| APPLICATION NO. | : 11/634765 |
| DATED | : February 3, 2009 |
| INVENTOR(S) | : Shahla Khorram |

Page 1 of 1

It is certified that error appears in the above-identified patent and that said Letters Patent is hereby corrected as shown below:

Title page, after "(65) Prior Publication Data US 2008/0136535A1 Jun. 12, 2008" insert --Related U.S. Application Data (60) Provisional application No. 60/861,979 filed on Nov. 29, 2006--.

Column 1, line 10: replace "11/634,765" with --60/861,979--.

Signed and Sealed this

Thirty-first Day of August, 2010

David J. Kappos
*Director of the United States Patent and Trademark Office*